United States Patent
Singh

(10) Patent No.: US 10,217,615 B2
(45) Date of Patent: Feb. 26, 2019

(54) PLASMA PROCESSING APPARATUS AND COMPONENT THEREOF INCLUDING AN OPTICAL FIBER FOR DETERMINING A TEMPERATURE THEREOF

(71) Applicant: Lam Research Corporation, Fremont, CA (US)

(72) Inventor: Harmeet Singh, Alameda, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 362 days.

(21) Appl. No.: 14/107,641

(22) Filed: Dec. 16, 2013

(65) Prior Publication Data

US 2015/0170977 A1    Jun. 18, 2015

(51) Int. Cl.
 *C23C 16/50* (2006.01)
 *C23C 16/00* (2006.01)
 (Continued)

(52) U.S. Cl.
 CPC .. *H01J 37/32724* (2013.01); *H01J 37/32522* (2013.01); *H01J 37/32917* (2013.01);
 (Continued)

(58) Field of Classification Search
 USPC .............. 118/728–732; 156/345.51–345.55
 See application file for complete search history.

(56) References Cited

U.S. PATENT DOCUMENTS 5,361,130 A  * 11/1994 Kersey ............... G01D 5/35303
                                                        250/227.27
6,204,920 B1 *  3/2001 Ellerbrock ......... G01D 5/35383
                                                        250/227.13
(Continued)

FOREIGN PATENT DOCUMENTS

JP           601918 A      1/1985
JP           621176 A      1/1987
(Continued)

OTHER PUBLICATIONS

Wikipedia entry for Sunlight. Accessed Mar. 5, 2017 from https://en.wikipedia.org/wiki/Sunlight.*
(Continued)

*Primary Examiner* — Parviz Hassanzadeh
*Assistant Examiner* — Tiffany Z Nuckols

(57) ABSTRACT

A plasma processing apparatus for processing semiconductor substrates comprises a plasma processing chamber in which a semiconductor substrate is processed. A process gas source is in fluid communication with the plasma processing chamber and is adapted to supply a process gas into the plasma processing chamber. A RF energy source is adapted to energize the process gas into a plasma state in the plasma processing chamber. Process gas and byproducts of the plasma processing are exhausted from the plasma processing chamber through a vacuum port. At least one component of the plasma processing apparatus comprises a laterally extending optical fiber beneath a plasma exposed surface of the component wherein spatial temperature measurements of the surface are desired to be taken, and a temperature monitoring arrangement coupled to the optical fiber so as to monitor temperatures at different locations along the optical fiber.

13 Claims, 7 Drawing Sheets

(51) Int. Cl.
  *C23F 1/00* (2006.01)
  *H01J 37/32* (2006.01)
  *H01L 21/67* (2006.01)

(52) U.S. Cl.
  CPC .. *H01J 37/32935* (2013.01); *H01L 21/67103* (2013.01); *H01L 21/67109* (2013.01); *H01L 21/67248* (2013.01)

(56) References Cited

U.S. PATENT DOCUMENTS

| | | | |
|---|---|---|---|
| 6,647,160 B1 * | 11/2003 | Chi | G01D 5/35303 385/10 |
| 6,847,014 B1 | 1/2005 | Benjamin et al. | |
| 6,891,124 B2 * | 5/2005 | Denton | G01K 11/12 156/345.27 |
| 6,899,109 B1 | 5/2005 | Nguyen | |
| 6,921,724 B2 | 7/2005 | Kamp et al. | |
| 7,187,816 B2 | 3/2007 | Huang | |
| 7,283,692 B2 | 10/2007 | Xiao et al. | |
| 7,505,642 B2 | 3/2009 | Tam et al. | |
| 7,732,728 B2 | 6/2010 | Dhindsa et al. | |
| 7,883,632 B2 | 2/2011 | Honda et al. | |
| 7,956,310 B2 | 6/2011 | Koshimizu et al. | |
| 8,098,966 B2 | 1/2012 | Bayindir et al. | |
| 8,216,486 B2 | 7/2012 | Dhindsa et al. | |
| 8,240,913 B2 | 8/2012 | Zheng et al. | |
| 8,296,091 B2 | 10/2012 | Timans | |
| 8,303,176 B2 | 11/2012 | Kochergin | |
| 8,337,660 B2 | 12/2012 | Buchberger, Jr. et al. | |
| 8,351,742 B2 | 1/2013 | Wong et al. | |
| 8,389,416 B2 | 3/2013 | Luong | |
| 8,461,674 B2 | 6/2013 | Gaff et al. | |
| 8,500,953 B2 | 8/2013 | Chang et al. | |
| 8,536,494 B2 | 9/2013 | Benjamin et al. | |
| 8,546,732 B2 | 10/2013 | Singh | |
| 8,587,113 B2 | 11/2013 | Gaff et al. | |
| 2004/0197067 A1 | 10/2004 | Kumagai et al. | |
| 2005/0053383 A1 * | 3/2005 | West | G02B 6/12004 398/153 |
| 2006/0016554 A1 * | 1/2006 | Ahn | H01L 21/6831 156/272.2 |
| 2007/0280605 A1 | 12/2007 | Mendoza | |
| 2008/0073335 A1 * | 3/2008 | Tsukamoto | H01L 21/67103 219/448.11 |
| 2008/0227349 A1 * | 9/2008 | Eyck | A41D 13/1281 442/60 |
| 2009/0159566 A1 | 6/2009 | Brillhart et al. | |
| 2010/0040108 A1 * | 2/2010 | Sasaoka | G01K 11/32 374/120 |
| 2010/0163546 A1 | 7/2010 | Nanno et al. | |
| 2011/0005686 A1 * | 1/2011 | Tanaka | H01L 21/68757 156/345.52 |
| 2011/0092072 A1 | 4/2011 | Singh et al. | |
| 2011/0143462 A1 | 6/2011 | Gaff et al. | |
| 2011/0247234 A1 | 10/2011 | Friess et al. | |
| 2011/0267598 A1 | 11/2011 | Hjort et al. | |
| 2012/0050735 A1 | 3/2012 | Higgins et al. | |
| 2012/0097661 A1 | 4/2012 | Singh | |
| 2012/0177319 A1 | 7/2012 | Alemohammad et al. | |
| 2012/0327394 A1 | 12/2012 | Matsudo et al. | |
| 2013/0068750 A1 | 3/2013 | Gaff et al. | |
| 2013/0072035 A1 * | 3/2013 | Gaff | F25B 21/04 438/798 |
| 2013/0097840 A1 | 4/2013 | Schaefer et al. | |
| 2013/0128275 A1 | 5/2013 | Matsudo et al. | |
| 2013/0136146 A1 | 5/2013 | Creeden et al. | |
| 2013/0162963 A1 | 6/2013 | Spruit et al. | |
| 2013/0169445 A1 | 7/2013 | Carralero et al. | |
| 2013/0180963 A1 | 7/2013 | Zhang et al. | |
| 2013/0220989 A1 | 8/2013 | Pease et al. | |
| 2014/0154819 A1 | 6/2014 | Gaff et al. | |
| 2014/0356985 A1 | 12/2014 | Ricci et al. | |

FOREIGN PATENT DOCUMENTS

| | | |
|---|---|---|
| JP | 06010391 | 3/1994 |
| JP | 2004152913 A | 5/2004 |
| JP | 2007081160 A | 3/2007 |
| JP | 2007082374 A | 3/2007 |
| JP | 2009267256 A | 11/2009 |
| JP | 2010153730 A | 7/2010 |
| KR | 201998028601 U | 8/1998 |
| KR | 1020050053464 A | 6/2005 |
| KR | 20050121913 A | 12/2005 |
| KR | 1020060067552 A | 6/2006 |
| WO | 2010/072293 A2 | 7/2010 |

OTHER PUBLICATIONS

Office Action (Notification of the Final Office Action) dated Apr. 26, 2016, by the Korean Patent Office in corresponding Korean Patent Application No. 10-2013-7012033, and a Partial English Translation of the Office Action. (5 pages).

* cited by examiner

PLASMA PROCESSING APPARATUS AND COMPONENT THEREOF INCLUDING AN OPTICAL FIBER FOR DETERMINING A TEMPERATURE THEREOF

FIELD OF THE INVENTION

The present invention relates to components of semiconductor plasma processing apparatuses, and more specifically to a component which includes a laterally extending optical fiber to monitor temperatures at different locations along the optical fiber.

BACKGROUND

Plasma processing apparatuses are used to process semiconductor substrates by techniques including etching, plasma enhanced physical vapor deposition (PEPVD), chemical vapor deposition (CVD), plasma enhanced chemical vapor deposition (PECVD), atomic layer deposition (ALD, ion implantation, and resist removal. Due to shrinking feature sizes and the implementation of new materials, improvements in plasma processing apparatuses to control and monitor the conditions of the plasma processing, such as component temperature during processing, are required.

SUMMARY

Disclosed herein is a plasma processing apparatus for processing semiconductor substrates. The plasma processing apparatus comprises a plasma processing chamber in which a semiconductor substrate is processed. A process gas source is in fluid communication with the plasma processing chamber and is adapted to supply a process gas into the plasma processing chamber. A RF energy source is adapted to energize the process gas into a plasma state in the plasma processing chamber. Process gas and byproducts of the plasma processing are exhausted from the plasma processing chamber through a vacuum port. At least one component of the plasma processing apparatus comprises a laterally extending optical fiber beneath a plasma exposed surface of the component wherein spatial temperature measurements of the surface are desired to be taken, and a temperature monitoring arrangement coupled to the optical fiber so as to monitor temperatures at different locations along the optical fiber.

Also disclosed herein is a component of a plasma processing apparatus. The component comprises a laterally extending optical fiber beneath a plasma exposed surface of the component wherein spatial temperature measurements of the surface are desired to be taken, wherein the laterally extending optical fiber is configured to be coupled to a temperature monitoring arrangement such that temperatures at different locations along the optical fiber can be monitored.

Further disclosed herein is a method of plasma processing a semiconductor substrate in the a plasma processing apparatus which includes a component that comprises a laterally extending optical fiber beneath a plasma exposed surface of the component wherein spatial temperature measurements of the surface are desired to be taken, wherein the laterally extending optical fiber is coupled to a temperature monitoring arrangement such that temperatures at different locations along the optical fiber can be monitored. The method comprises supplying process gas from a process gas source into a plasma processing chamber of the apparatus, supplying RF energy into the plasma processing chamber to generate plasma from the process gas, and plasma processing a semiconductor substrate in the plasma processing chamber. The method further comprises providing light into the laterally extending optical fiber of the component, detecting light exiting the laterally extending optical fiber, and determining the temperature at different locations along the optical fiber based on the parameters of the light entering and exiting the optical fiber.

BRIEF DESCRIPTION OF THE DRAWING FIGURES

DETAILED DESCRIPTION

Figure 1:
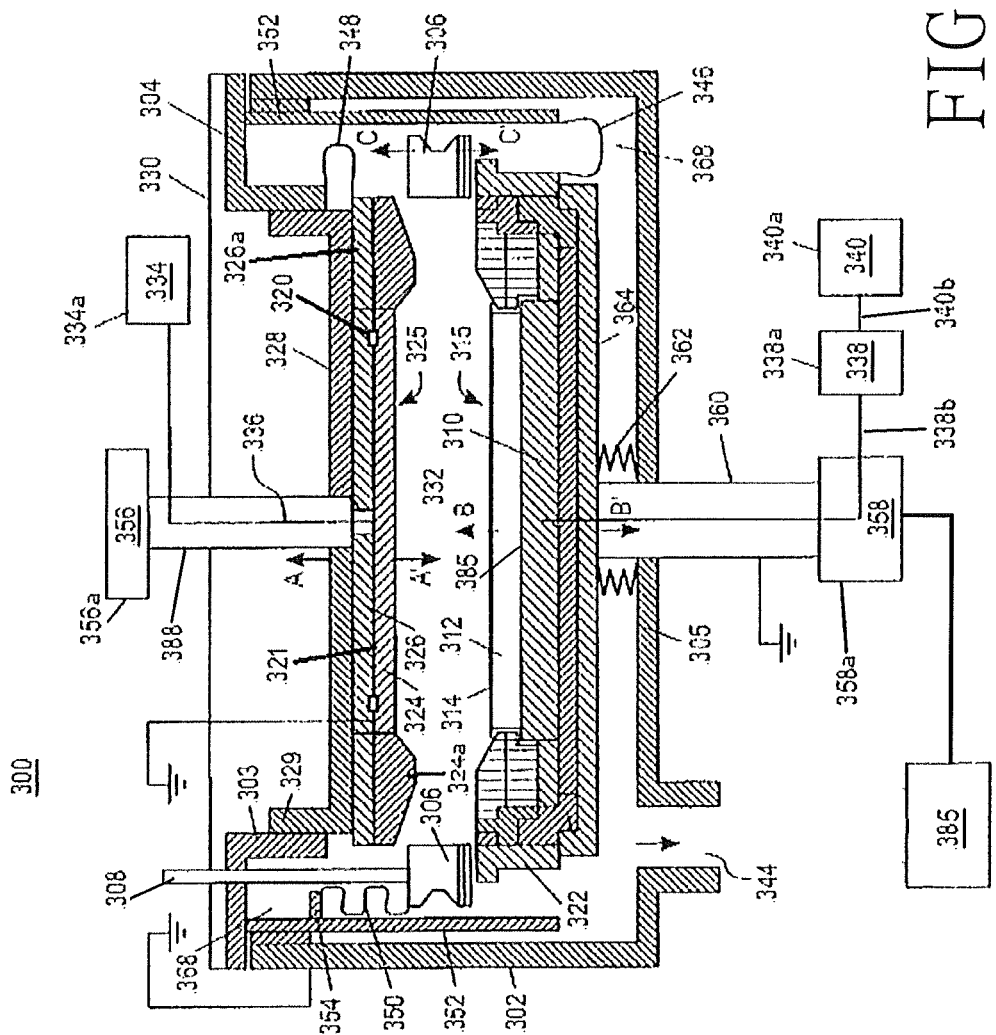
FIG. 1 illustrates an exemplary embodiment of a capacitively coupled plasma etching chamber in which embodiments of the component can be installed.

Disclosed herein are components of semiconductor plasma processing apparatuses which each include a laterally extending optical fiber (optical fiber) beneath a plasma exposed surface of the component wherein spatial temperature measurements of the surface are desired to be taken, wherein the laterally extending optical fiber is configured to be coupled to a temperature monitoring arrangement such that temperatures at different locations along the optical fiber can be monitored. The semiconductor plasma processing apparatus preferably includes a vacuum chamber, which may be a plasma etching or deposition chamber (herein referred to as "vacuum chamber") of a semiconductor plasma processing apparatus. In the following description, numerous specific details are set forth in order to provide a thorough understanding of the present embodiments. It will be apparent, however, to one skilled in the art that the present embodiments may be practiced without some or all of these specific details. In other instances, well known process operations have not been described in detail in order not to unnecessarily obscure present embodiments disclosed herein. Additionally, as used herein, the term "about" when used with reference to numerical values refers to ±10%.

The suitable performance of many components used during plasma processing depends on maintaining a suitable or desired temperature of the component during the plasma processing. Further, the performance of many plasma processing processes depends upon a temperature profile of a substrate supported on an upper surface of a substrate support assembly. For example, during plasma processing, a substrate support assembly may be configured to tune the spatial and/or temporal temperature profile of a substrate supported on the upper surface thereof. To tune the substrate temperature profile, an array of thermal control elements included in the substrate support assembly can controlled to tune the temperature of the upper surface of the substrate support assembly, thereby controlling the temperature profile of the substrate supported on the upper surface of the substrate support assembly. Exemplary embodiments of substrate support assemblies and heating arrangements (i.e. tuning arrangements) for substrate support assemblies can be found in commonly-assigned U.S. Pat. No. 8,461,674, and commonly-assigned U.S. Published Application Nos. 2011/0092072, 2012/0097661, 2013/0068750, 2013/0220989, and 2011/0143462, and commonly-assigned U.S. patent application Ser. No. 13/908,676, which are hereby incorporated by reference in their entirety. An exemplary embodiment of a power supply and power switching system for a substrate support assembly including an array of thermal control elements electrically connected to the power supply and power switching system can be found in commonly-assigned U.S. patent application Ser. No. 13/690,745, which is hereby incorporated by reference in its entirety.

The substrate support assembly can comprise an electrostatic chuck (ESC) useful for electrostatically clamping the semiconductor substrate (substrate) onto the substrate support assembly during processing. The substrate support assembly may comprise a ceramic substrate holder, a fluid-cooled heat sink (i.e. a cooling plate) and a plurality of planar heater zones to realize step by step and radial temperature control, azimuthal temperature control, and/or die by die temperature control of the substrate support assembly. For example, in an embodiment, the fluid-cooled heat sink can be maintained between about −20° C. and 80° C. wherein an array of thermal control elements (heaters) can maintain a support surface, and thereby a substrate supported on the support surface, of the substrate support assembly at temperatures of about 0° C. to 90° C. above the fluid cooled heat sink temperature. By changing the heater power supplied to the array of thermal control elements forming the plurality of planar heater zones, the temperature profile of the upper surface of the substrate support assembly, and thereby the temperature profile of the substrate supported on the upper surface of the substrate support assembly, can be controlled.

However, controlling temperature is not an easy task for several reasons. First, many factors can affect heat transfer, such as the locations of heat sources and heat sinks, the RF profile, and the movement, materials and shapes of the media. Second, heat transfer is a dynamic process. Unless the system in question is in heat equilibrium, heat transfer will occur and the temperature profile and heat transfer will change with time. Third, non-equilibrium phenomena, such as plasma generated during plasma processing make theoretical prediction of the heat transfer behavior of any practical plasma processing apparatus very difficult if not impossible.

Therefore, it is beneficial to provide accurate temperature measurements of components, and plasma exposed surfaces of the components, used in plasma processing, such as a substrate support assembly, in order to provide better temperature control of the respective components. However, while processing a substrate in the plasma processing apparatus, changing processing conditions, such as changing gas flow rates, processing temperatures, plasma temperatures, plasma density, RF profile, and the like, can cause noise to be collected by many kinds of temperature sensors which monitor component temperature, or sensors which monitor parameters required to derive component temperature. Therefore, accurate temperature measurement of components of the plasma processing apparatus, and noise free temperature measurements of components of the plasma processing apparatus are desirable.

FIG. 1 shows an embodiment of an adjustable gap capacitively-coupled plasma (CCP) etching chamber 300 ("chamber") of a plasma processing apparatus which can include components according to embodiments disclosed herein. Components according to embodiments disclosed herein each include a laterally extending optical fiber coupled to a temperature monitoring arrangement so as to monitor temperatures at different locations along the optical fiber and operable to determine spatial temperatures of a plasma exposed surface of the component. The chamber 300 includes chamber housing 302; an upper electrode assembly 325 mounted to a ceiling 328 of the chamber housing 302; a lower electrode assembly 315 (i.e. substrate support assembly) mounted to a floor 305 of the chamber housing 302, spaced apart from and substantially parallel to the lower surface of the upper electrode assembly 325; a confinement ring assembly 306 surrounding a gap 332 between the upper electrode assembly 325 and the lower electrode assembly 315; an upper chamber wall 304; and a chamber top 330 enclosing the top portion of the upper electrode assembly 325.

The upper electrode assembly 325 preferably includes an upper showerhead electrode 324 and a backing plate 326. The upper electrode assembly 325 may also optionally include an outer electrode 324a surrounding the upper showerhead electrode 324 as well as an optional backing ring 326a surrounding the backing plate 326. The upper showerhead electrode 324 and backing plate 326 include aligned gas passages for distributing process gas into the gap 332 defined between the upper showerhead electrode 324 and the lower electrode assembly 315. The upper electrode assembly 325 can include additional components such as RF gasket 320, a heating element 321, and other parts. The chamber housing 302 has a gate (not shown) through which a substrate 314, is loaded or unloaded to or from the chamber 300. For example, the substrate 314 can enter the chamber through a load lock as described in commonly-assigned U.S. Pat. No. 6,899,109, which is hereby incorporated by reference in its entirety.

The upper showerhead electrode 324 is preferably formed from a semiconductor compatible material such as single crystal silicon or polysilicon. The backing plate 326 is preferably formed from aluminum or an aluminum alloy. Preferably, the backing plate 326 and showerhead electrode 324 are configured such that they may conduct heat and direct RF current therethrough.

In some exemplary embodiments, the upper electrode assembly 325 is adjustable in up and down directions (arrows A and A' in FIG. 1) to adjust the gap 332 between the upper and lower electrode assemblies 325/315. An upper assembly lift actuator 356 raises or lowers the upper electrode assembly 325. In the illustration, annular extension 329 extending vertically from the chamber ceiling 328 is adjustably positioned along cylindrical bore 303 of the upper chamber wall 304. A sealing arrangement (not shown) may be used to provide a vacuum seal between 329/303, while allowing the upper electrode assembly 325 to move relative to the upper chamber wall 304 and lower electrode assembly 315. A RF return strap 348 can electrically couple the upper electrode assembly 325 and, the upper chamber wall 304 such that current may be conducted therethrough.

For brevity, only one gas line 336 connected to gas source 334 is shown in FIG. 1 wherein the gas line extends through shaft 388. Additional gas lines can be coupled to the upper electrode assembly 325, and the gas can be supplied through other portions of the upper chamber wall 304 and/or the chamber top 330.

In other exemplary embodiments, the lower electrode assembly 315 may move up and down (arrows B and B' in FIG. 1) to adjust the gap 332, while the upper electrode assembly 325 may be stationary or movable. FIG. 1 illustrates a lower assembly lift actuator 358 connected to a shaft 360 extending through the floor (bottom wall) 305 of the chamber housing 302 to a lower conducting member 364 supporting the lower electrode assembly 315. A bellows 362 forms part of a sealing arrangement to provide a vacuum seal between the shaft 360 and the floor 305 of the chamber housing 302, while allowing the lower electrode assembly 315 to move relative to the upper chamber wall 304 and upper electrode assembly 325 when the shaft 360 is raised and lowered by the lower assembly lift actuator 358. Preferably the shaft 360 is hollow such that magnetically sensitive sensors and electrical connections can be supplied therethrough. If desired, the lower electrode assembly 315 can be raised and lowered by other arrangements. For example, another embodiment of an adjustable gap capacitively coupled plasma processing chamber which raises and lowers the lower electrode assembly 315 by a cantilever beam is disclosed in commonly-assigned U.S. Pat. No. 7,732,728, which is hereby incorporated by reference in its entirety.

If desired, the movable lower electrode assembly 315 can be grounded to a wall of the chamber by at least one lower RF strap 346 which electrically couples an outer edge ring (ground ring) 322 to an electrically conductive part, such as a chamber wall liner 352 and provides a short RF return path for plasma, while allowing the lower electrode assembly 315 to move vertically within the chamber 300 such as during multistep plasma processing wherein the gap is set to different heights.

The lower electrode 310 is typically supplied with RF power from one or more RF power supplies 340 coupled to the lower electrode 310 through an impedance matching network 338. The RF power can be supplied at one or more frequencies of, for example, 400 KHz, 2 MHz, 13.56 MHz, 27 MHz, and 60 MHz. The RF power excites the process gas to produce plasma in the gap 332. In some embodiments the upper showerhead electrode 324 and chamber housing 302 are electrically coupled to ground. In other embodiments the upper showerhead electrode 324 is insulated from the chamber housing 302 and supplied RF power from a RF supply through an impedance matching network.

The bottom of the upper chamber wall 304 includes a vacuum port 344 wherein a vacuum pump unit (not shown) can be coupled to the vacuum port 344 such that gas may be exhausted from the chamber 300. Preferably, the confinement ring assembly 306 substantially terminates the electric fields formed within the gap 332 and prevents the electric fields from penetrating an outer chamber volume 368. The confinement ring assembly 306 can be grounded to a wall of the chamber by at least one flexible RF strap 350 which electrically couples the confinement ring assembly 306 to an electrically conductive part such as upper chamber wall 304. In an embodiment, the confinement ring assembly 306 can be supported by a support member 308 such that the confinement ring assembly 306 may be raised and lowered by an actuator (not shown). FIG. 1 shows a conductive chamber wall liner 352 supported via a horizontal extension 354. Preferably the horizontal extension 354 is electrically conductive. The RF strap(s) 350 preferably provide a short RF return path by electrically coupling the confinement ring assembly 306 to the horizontal extension 354 or alternatively the upper chamber wall 304. The RF strap(s) 350 can provide conductive paths between the confinement ring assembly 306 and the upper chamber wall 304 at various vertical positions of the confinement ring assembly 306 within the chamber 300.

Process gas injected into the gap 332 is energized to produce plasma to process the substrate 314, passes through the confinement ring assembly 306, and into outer chamber volume 368 until exhausted through the vacuum port 344 by the vacuum pump unit.

In an embodiment the RF power supply 340 supplies RF power to the lower electrode assembly 315 during operation, the RF power supply 340 delivers RF energy via shaft 360 to the lower electrode 310. The process gas in the gap 332 is electrically excited to produce plasma by the RF power delivered to the lower electrode 310.

Figure 2:
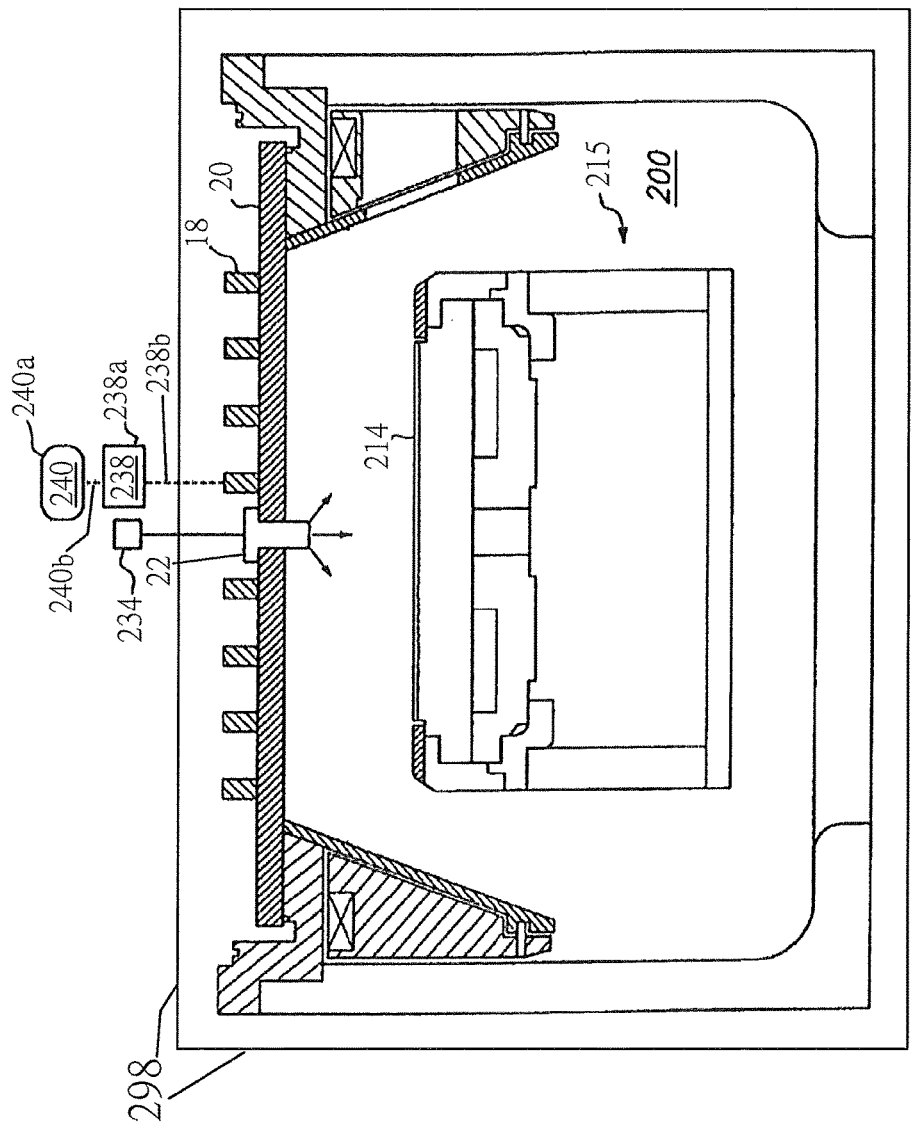
FIG. 2 illustrates an exemplary embodiment of an inductively coupled plasma etching chamber in which embodiments of the component can be installed.

FIG. 2 illustrates an embodiment of an inductively coupled plasma processing apparatus wherein embodiments of components disclosed herein may be included. The inductively coupled plasma processing apparatus can include a vacuum chamber 200. The vacuum chamber 200 includes a lower electrode assembly 215 for supporting a substrate 214 in the interior of the vacuum chamber 200. A dielectric window 20 forms a top wall of vacuum chamber 200. Process gases are injected to the interior of the vacuum chamber 200 through a gas injector 22. A gas source 234 supplies process gases to the interior of the vacuum chamber 200 through gas injector 22.

Once process gases are introduced into the interior of vacuum chamber 200, they are energized into a plasma state by an antenna 18 supplying energy into the interior of vacuum chamber 200. Preferably, the antenna 18 is an external planar antenna powered by a RF power source 240 and RF impedance matching circuitry 238 to inductively couple RF energy into vacuum chamber 200. However, in an alternate embodiment, the antenna 18 may be an external or embedded antenna which is nonplanar. An electromagnetic field generated by the application of RF power to planar antenna energizes the process gas in the interior of the vacuum chamber 200 to form a high-density plasma (e.g., $10^9$-$10^{12}$ ions/cm$^3$) above substrate 214. During an etching process, the antenna 18 (i.e. a RF coil) performs a function analogous to that of a primary coil in a transformer, while the plasma generated in the vacuum chamber 200 performs a function analogous to that of a secondary coil in the transformer. Preferably, the antenna 18 is electrically connected to the RF impedance matching circuitry 238 by an electrical connector 238b (i.e. lead) and the RF power source 240 is electrically connected to the RF impedance matching circuitry 238 by an electrical connector 240b.

Plasma chamber components which each include a laterally extending optical fiber beneath a plasma exposed surface of the component wherein spatial temperature measurements of the surface are desired to be taken, wherein the laterally extending optical fiber is configured to be coupled to a temperature monitoring arrangement such that temperatures at different locations along the optical fiber can be monitored can include the upper electrode assembly 225, the lower electrode assembly 215, the confinement ring assembly 206, the upper showerhead electrode 224, the backing plate 226, the outer electrode 224a, the optional backing ring 226a, the dielectric window 20, the antenna 18, the upper chamber wall 204, and chamber walls such as the chamber top 230, and the floor 205.

The temperature monitoring arrangement coupled to the laterally extending optical fiber is preferably a sensor system wherein the sensor system includes a light source and a light detector. A light signal, such as a UV, natural, near infrared, or infrared light signal, is generated by the light source in the sensor system wherein the light signal enters into an end of the optical fiber. The light then exits the optical fiber, having traveled along a length of the optical fiber wherein the light is subsequently detected by the detector wherein the light can be analyzed. Depending on the details of the implementation, the light received at the detector of the sensor system may have traveled along the entire length of the optical fiber, or may have been reflected back from an intermediate point of the optical fiber. In one embodiment, the sensor system can include two pairs of light sources and detectors, one pair arranged at each end of the optical fiber to provide redundancy in the system.

The optical properties of the laterally optical fiber will be affected by changes in its temperature. For example, as a section of the optical fiber experiences a change in its temperature, it will undergo thermal expansion and a change in refractive index. These changes can be detected by detecting changes in the optical properties of the light entering the optical fiber and subsequently exiting the optical fiber and captured by the detector.

In the case of interferometry sensing techniques, changes in the optical path length provided by the optical fiber due to changes in its physical length or refractive index are used to provide an indication of temperature. The light emitted from the optical fiber is allowed to interfere with light from the light source, which has not passed along the same optical fiber, to form an interference signal. The magnitude of the interference signal will be sensitive to the phase difference between the received light signal compared to that of the original light signal. Thus, providing the wavelength of the original light source is chosen to give an interference signal sensitive to the length changes experienced by the optical fiber, the magnitude of the interference signal can be used as a measure of the temperature of the optical fiber and therefore portions of the component to which the optical fiber is in thermal contact with. A suitable range of wavelengths are those corresponding to visible light, ultraviolet light, infrared light, and the near infrared region of the electromagnetic spectrum. Preferably the light source is a laser light source such as a SLD light source. Particular wavelengths are selected depending on the propagation properties of light in the particular optical fiber.

Figure 7:
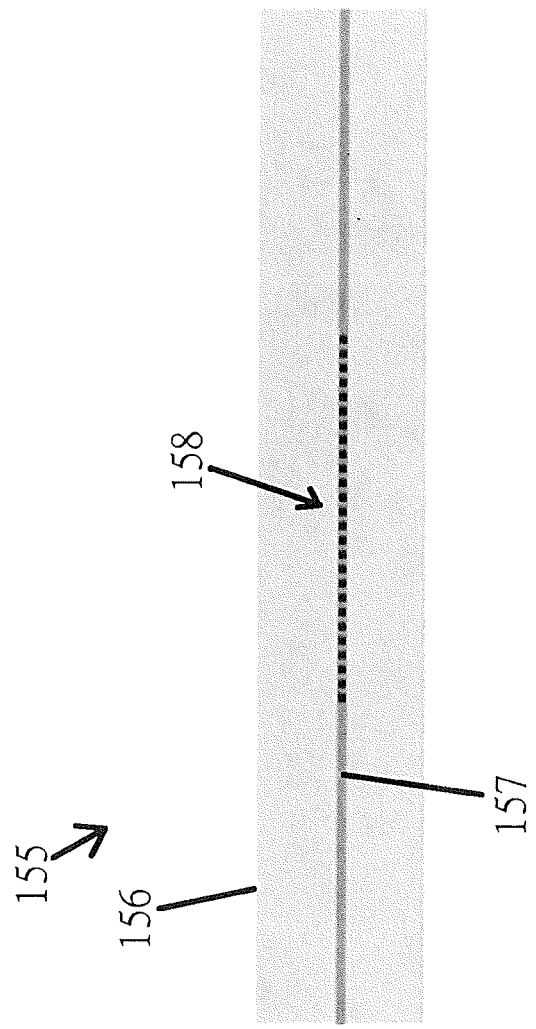
FIG. 7 illustrates an optical fiber which includes a fiber Bragg grating.

In a preferred embodiment, one or more optical gratings, such as one or more fiber Bragg gratings (FBG), are formed in the optical fiber along the length thereof. For example, as illustrated in FIG. 7, an optical fiber 155 can include a cladding 156, a core 157, and gratings in the core 157 such as FBG 158. Each FBG is tuned such that it will reflect a particular wavelength of light determined by the grating's respective dimensions. If the section of the optical fiber having the FBG is placed in thermal contact with a portion of the component, such as beneath a plasma exposed surface of the component, wherein a temperature measurement is desired to be taken, then the changes in the length of the optical fiber at the location in thermal contact with component, will result in a change in both the dimensions of the FBG and the refractive index of the optical fiber. Both effects alter the wavelength of any the light reflected and/or transmitted by the FBG, which can therefore be used as a measure of the temperature of the optical fiber at the location of the FBG. Long Period Gratings (LPGs) may also be used in similar fashion to FBGs, although in practice with LPGs it is typically only the wavelengths of the light that are transmitted that are used as the basis of the sensor, rather than those reflected. In the following discussion the two terms are used interchangeably, where appropriate.

FBGs are advantageous as a single optical fiber can be provided with a plurality of FBGs along a length thereof where each FBG is sensitive to a different wavelength of light, and each FBG along the length of the optical fiber corresponds to a respective location of the component, such as a surface of the component, wherein a temperature is desired to be measured. Thus, for example, the temperature of a particular die of a substrate supported on the upper surface of a substrate support assembly can be determined in isolation from the remaining dies of the substrate by arranging the optical fiber such that each FBG thereof corresponds to a respective die of the substrate and then inserting light of the corresponding wavelength of each respective FBG which is in thermal contact with the respective die to determine a local temperature thereof. In such techniques, the light source may usually be a narrow spectrum or a wide spectrum light source, and/or a tuned or non-tuned light source. It is possible to use a plurality of FBGs that reflect/transmit light at fundamentally the same wavelength. In this case time division multiplexing is required to distinguish the different sensor signals for each FBG.

The light source itself can be any suitable opto-electronic light source, such as light emitting diode, super luminescent diode (SLD), or similar laser device.

Interferometry techniques can also be used based on the changes in length and refractive index of the optical fiber with temperature. These can readily be used to determine the temperature over a larger area, such as generally across an upper surface of a substrate support assembly.

In a preferred embodiment, the component is an electrostatic chuck (ESC) configured to support a substrate on an upper surface thereof, wherein the electrostatic chuck includes the laterally extending optical fiber in a channel in the component, or in an alternate embodiment, at least two laterally extending optical fibers in a single channel of the ESC or in at least two respective channels of the ESC. In a preferred embodiment, the optical fiber is bonded in the channel of the ESC with an adhesive wherein the channel is in a lower surface of the ESC. A secure attachment to the ESC, or any respective component, can be achieved using a glue or adhesive such as a glass reinforced epoxy resin which can also be selected to have a similar or substantially identical thermal expansion to the ESC, or respective component, and/or the optical fiber to which it is adhered. The attachment could also be made using silicone gels or adhesives, such as a low modulus silicone. Small differences in thermal expansion coefficient between the optical fiber and the component may result in strain being introduced into the optical fiber through the different expansion of the adhesive, and inaccuracies in the temperature measurement, and so should be avoided or mitigated where possible.

Any suitable width of optical fiber can be used. In this example, the diameter of the optical fiber can be about 0.1 mm to 5 mm. The optical fiber can include 1-40 or more FBGs therein.

The sensor system is preferably an interrogator, such as a high resolution near infrared spectrometer used in conjunction with a broadband light source which is configured to interrogate the status of each FBG sensor, a tunable laser system, a scanning etalon or interferometer, or the like. Preferably the data acquisition rate of the interrogator is about 1 Hz to about 5 MHz, or greater. In a preferred embodiment, the interrogator uses the principle of wavelength division demultiplexing (WDDM), commonly used in WDM (wavelength division multiplexing) telecommunication networks, to separate signals from each of the FBGs and interrogate the status of each of the individual FBGs in an array of (about 1 to 40) FBGs distributed along a single optical fiber in real time. The interrogator in a preferred embodiment can use a passive demodulation technique, based on WDM interference filters, in which the wavelength encoded optical signature of each of the FBGs in the array is transformed to an electric signal at each of the detectors of the sensor system receiving the optical signature by means of the bandpass optical properties of the interference filter. The transformed electrical signal carrying the information from each of the FBGs can be processed by a CPU or a microprocessor controller which can be mounted on a PC board equipped with conventional flash memory data storage and data transmission elements such as those from USB, Ethernet, wireless, or Bluetooth.

In an embodiment, each fiber Bragg grating distributed along the optical fiber reflects a portion of the light entering the optical fiber, determined by the Bragg condition of the grating, and transmits the remaining light to the next grating. The returned wavelength encoded light signal from each of the distributed FBGs is received and processed by the sensor system. A wavelength selective WDM interference optical filter, located in front of the detector, allows the transmission of a selective FBG wavelength to the detector while reflecting all of the other FBG sensor wavelengths. This process is repeated, for each FBG, such that an optical signal for each FBG can be collected.

The component preferably comprises a channel which extends beneath an exposed surface thereof wherein one or more temperature measurements of the surface are desired to be taken, and the laterally extending optical fiber in the channel of the component wherein the optical fiber is in coupled to the temperature monitoring arrangement so as to monitor temperatures at different locations along the optical fiber. In an embodiment the component can include at least two laterally extending optical fibers beneath the exposed surface of the component wherein spatial temperature measurements of the surface are desired to be taken. Each optical fiber is configured to be coupled to the temperature monitoring arrangement so as to monitor temperatures at different locations of each optical fiber wherein the at least two laterally extending optical fibers are each configured to be beneath a respective portion of the exposed surface of the component wherein spatial temperature measurements are desired to be taken. The at least two laterally extending optical fibers can be in a single channel of the component or at least two respective channels of the component. The channel of the component is preferably in a lower surface thereof. Preferably the channel or the at least two channels include one or more curves, are linear, are circular, are semicircular, have a zig-zig-zag pattern, a spiral pattern, a serpentine pattern. In an embodiment, the channel can be circular wherein the channel can include a break therein.

Figure 3:
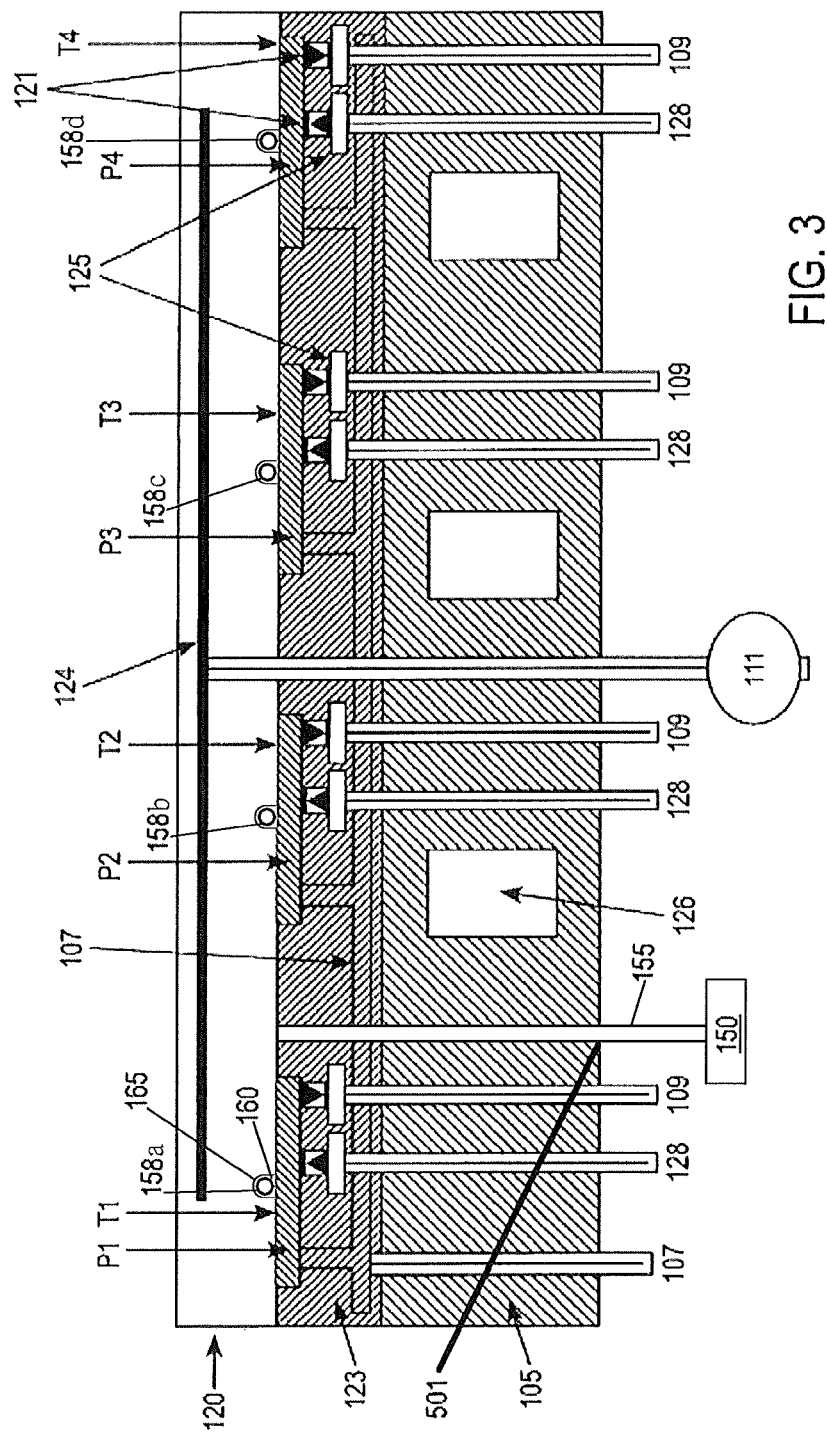
FIG. 3 illustrates an exemplary embodiment of a substrate support assembly wherein embodiments of the component can be installed.

FIG. 3 illustrates an exemplary embodiment of a substrate support assembly 100 which can include a component according to embodiments disclosed herein. The substrate support assembly 100 can comprise, in one embodiment, a heating plate having a heater layer 123 attached to the underside of a dielectric layer 120. The dielectric layer 120 has at least one ESC (electrostatic clamping) electrode 124 (e.g. monopolar or bipolar) therein to electrostatically clamp a substrate to the exposed upper surface of the assembly 100 by applying a DC voltage to the clamping electrode. The heater layer 123 can be made up of one or more layers made of a polymer material, an inorganic material, a ceramic such as silicon oxide, alumina, yttria, aluminum nitride or other suitable material. The dielectric layer 120 preferably includes a channel 165 and a laterally extending optical fiber 155 adhered to the walls of the channel 165 with an adhesive 160 wherein the optical fiber 155 is coupled to a sensor system 150 which is configured to determine a temperature at different locations along the length of the optical fiber 155. The channel 165 and the optical fiber 155 adhered therein are preferably patterned in a lower surface of the dielectric layer 120 (see FIGS. 6A, 6B). A cooling plate 105 containing coolant channels 126 for coolant flow is attached to a lower surface of the heater layer 123.

The temperature of the cooling plate 105 can be dynamically adjusted from, or alternatively maintained at a constant temperature of, for example, about −20° C. to +80° C. Exemplary embodiments of a substrate support assembles which include extended range temperature control can be found in commonly-assigned U.S. Pat. Nos. 8,546,732, and 6,921,724, which are hereby incorporated by reference in their entirety. The substrate support assembly 100 also preferably includes a plurality of heater zones such as heater zones T1, T2, T3, T4 incorporated in the heater layer 123 each of which includes a respective single thermoelectric Peltier device (i.e. thermoelectric module) or respective module of Peltier elements (P1, P2, P3, P4) connected to a common line 107, a positive voltage line 128 and a negative voltage line 109. In alternate embodiments, the substrate support assembly 100 can include more than four heater zones or less than four heater zones. Diodes 121 can be provided between the lines 128, 109 and the Peltier devices P1, P2, P3, P4 to control the direction of current flow. The electrostatic clamping electrode 124 is connected to a clamping voltage supply line 111.

As shown in FIG. 3, each of the planar heater zones, for example, T1, T2, T3, T4 is connected to a positive voltage line 128, a negative voltage line 109 and a common line 107. No two planar heater zones T1, T2, etc. share the same pair of lines 128/109 and 107. By suitable electrical switching arrangements, it is possible to connect either the positive voltage line 128 or the negative voltage line 109 and one of the common lines 107 to a power supply (not shown), whereby only the planar heater zone connected to this pair of lines is powered. The time-averaged heating power of each planar heater zone can be individually tuned by time-domain multiplexing. Exemplary embodiments of a substrate support assembles which include time-domain multiplexing can be found in commonly-assigned U.S. Pat. No. 8,587,113, which is hereby incorporated by reference in its entirety. The diode 121 connected between each planar heater zone T1, T2, T3, T4 and the positive or negative voltage line does not allow current flow from the planar heater zone to the inactive voltage line. The diodes 121 can be physically located in the heater layer or any suitable location. By activating a positive or negative voltage line, heating or cooling of the upper surface of a planar heater zone can be effected while the opposite side of the Peltier devices is cooled or heated by the cooling plate 105.

In a preferred embodiment, the optical fiber 155 enters the substrate support assembly through an inlet 501 wherein the optical fiber 155 includes a plurality of fiber Bragg gratings 158, such as fiber Bragg gratings 158a, 158b, 158c, 158d. Each fiber Bragg grating is preferably arranged such that it corresponds to a respective heater zone T1, T2, T3, T4, wherein each fiber Bragg grating is configured to measure a respective temperature of each heater zone T1, T2, T3, T3.

Figure 4:
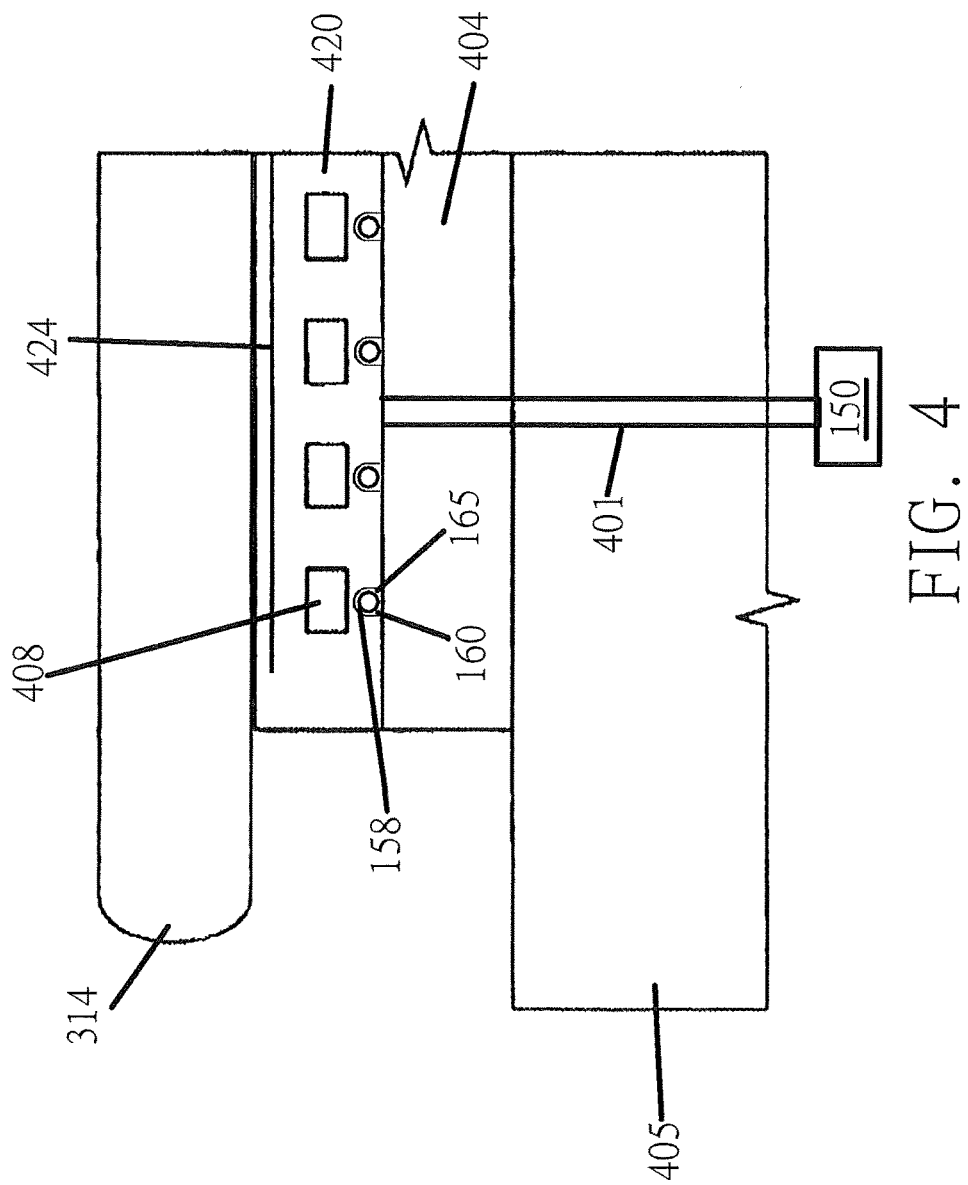
FIG. 4 illustrates an exemplary embodiment of a substrate support assembly wherein embodiments of the component can be installed.

In an alternate embodiment, as illustrated in FIG. 4, a substrate support assembly 400 can include a cooling plate 405 which can support a thermal insulator 404. A dielectric layer 420 is preferably mounted over the thermal insulator 304 wherein the dielectric layer 420 preferably includes at least one ESC electrode 424 and heaters 408 embedded therein. Preferably, the heaters 408 are resistive heaters and are arranged in the dielectric layer 420 such that they form a plurality of heater zones such as a rectangular grid of heater zones, concentric annular heater zones, radial heater zones, or a combination of radial and annular heater zones wherein one or more heaters form each heater zone. Preferably each heater is individually powered, or alternatively, each group of heaters is independently powered. The dielectric layer 420 preferably includes a channel 165 and a laterally extending optical fiber 155 adhered to the walls of the channel 165 with an adhesive 160 below the embedded heaters 408 wherein the optical fiber 155 is coupled to a sensor system 150 which is configured to determine a temperature at different locations along the length of the optical fiber 155. The channel 165 and the optical fiber 155 adhered therein are preferably patterned in a lower surface of the dielectric layer 420 (see FIGS. 5A, 5B).

In a preferred embodiment, the optical fiber 155 enters the substrate support assembly 400 through an inlet 401 wherein the optical fiber 155 includes a plurality of fiber Bragg gratings 158, such as a fiber Bragg gratings corresponding to each heater 408. In an alternative embodiment however, there may be fewer fiber Bragg gratings in the optical fiber 155 than heaters 408 embedded in the dielectric layer. In another alternative embodiment, one or more fiber Bragg gratings 158 can be arranged such that one or more of the fiber Bragg gratings correspond to a respective heater zone of the substrate support assembly 400, wherein each fiber Bragg grating is configured to measure a respective temperature of each heater zone.

Figure 5:
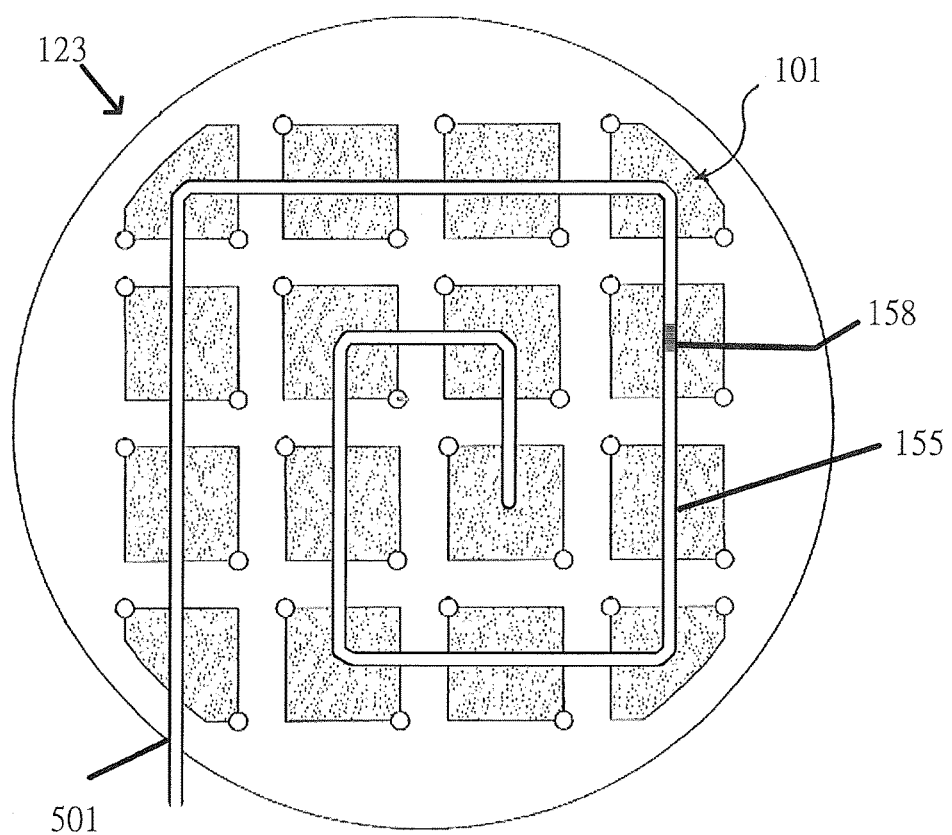
FIG. 5 illustrates a lower surface of a heater layer of a substrate support assembly which includes planar heater zones and a laterally extending optical fiber in thermal contact with each planar heater zone.

In an embodiment, as shown in FIG. 5, the heater layer 123 can include a plurality of the planar heater zones 101, and an optical fiber 155 which includes an FBG 158, or in an alternate embodiment a long period grating, in thermal contact with each respective planar heater zone 101 to determine a respective temperature of each of the planar heater zones 101. Preferably, the planar heater zones 101 are arranged to each correspond to a die of a respective substrate to be processed on an upper surface of the substrate support assembly. The sensor system (not shown) can be configured to determine the temperature of each planar heater zone 101 by time division multiplexing light reflected from each FBG 158. The optical fiber preferably enters the heater layer 123 through an inlet 501 in a non-exposed surface of the heater layer. The planar heater zones can be powered by a power supply and a plurality of power supply lines and a plurality of power return lines wherein each power supply line is connected to the power supply and to at least two planar heater zones, each power return line is connected to at least one planar heater zone, and no two planar heater zones share the same pair of power supply line and power return line.

Figure 6A:
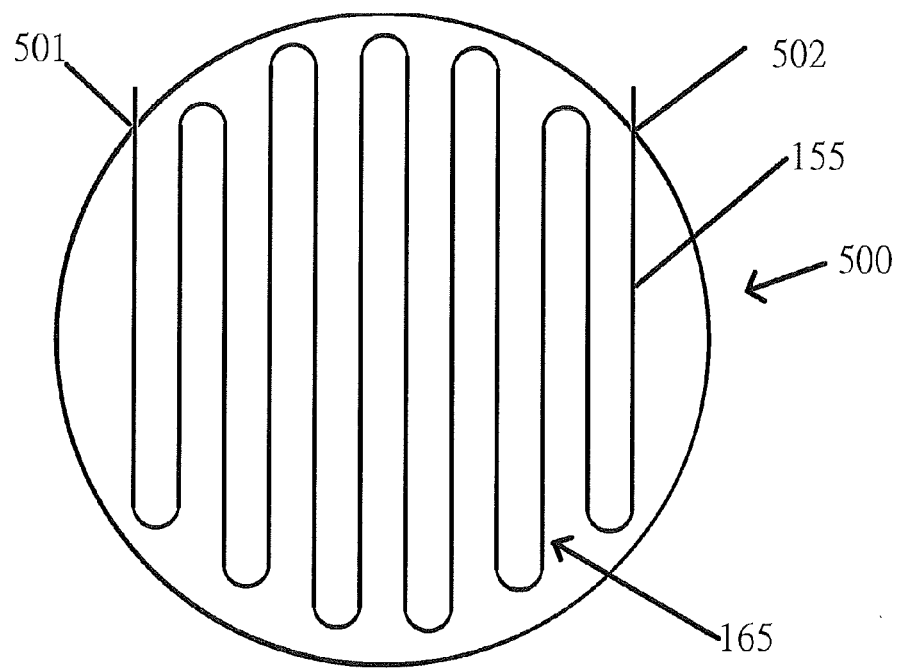
FIGS. 6A, 6B illustrate surfaces of exemplary components which each include a laterally extending optical fiber therein.
Figure 6B:
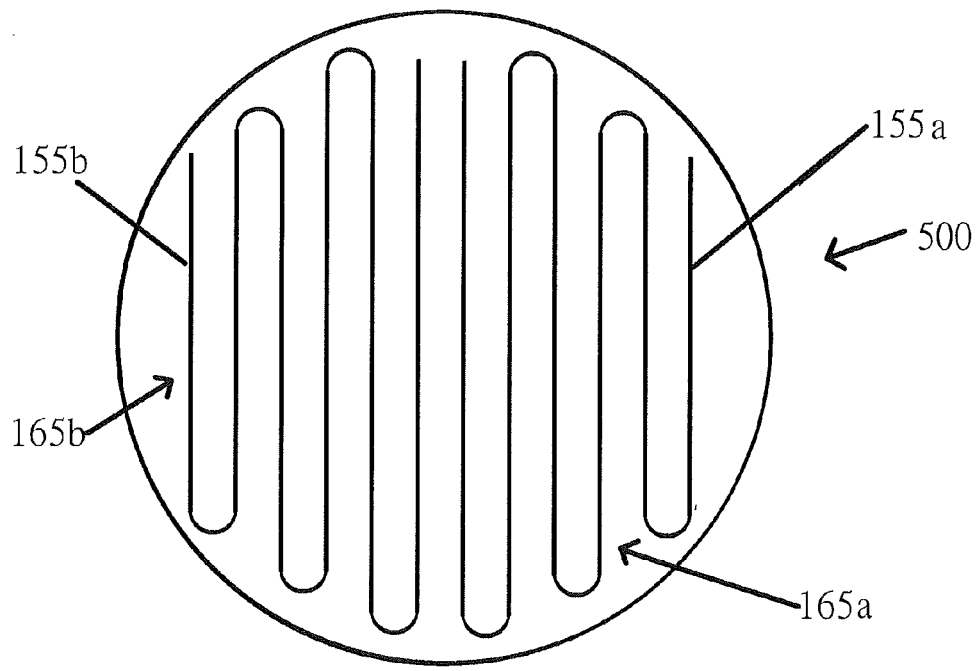

As illustrated in FIGS. 6A, 6B, the channel 165 is preferably patterned in the lower surface of the component 500. Preferably the optical fiber 155 enters the component 500 through an inlet 501 and exits the optical fiber 155 through in outlet 502 (see FIG. 6A) wherein the inlet and the outlet are in non-exposed surfaces of the component 500. In an alternate embodiment, the outlet 502 may be omitted. In an embodiment, the component 500 can include at least two channels (see FIG. 6B) such as a first channel 165a and a second channel 165b wherein a respective optical fiber 155a, 155b is in each respective channel of the component and wherein each optical fiber 155a, 155b is beneath a plasma exposed surface of the component wherein a temperature measurement is desired to be taken.

In a further embodiment, a method of plasma processing a semiconductor substrate in a semiconductor plasma processing apparatus including an embodiment of a component disclosed herein is disclosed. The method comprises supplying the process gas from the process gas source into the plasma processing chamber, supplying RF energy into the plasma processing chamber to generate plasma from the process gas; and plasma processing a semiconductor substrate in the plasma processing chamber. Before, during, and/or after processing, light can be provided into the laterally extending optical fiber of the component wherein the light exiting the optical fiber can be detected such that temperatures along the length of the optical fiber can be determined based on the parameters of the light entering and exiting the optical fiber. In an embodiment of the method, the optical fiber includes a plurality of fiber Bragg gratings along a length thereof, the method further comprises detecting light reflected from each fiber Bragg grating and determining the temperature of the optical fiber at the location of at least two of the fiber Bragg gratings based on the parameters of the light reflected from the respective fiber Bragg gratings. In an alternate embodiment, the optical fiber includes a plurality of long period gratings along a length thereof, the method further comprises detecting light transmitted through each long period grating and determining the temperature of the optical fiber at the location of at least two of the long period gratings based on the parameters of the light transmitted through the respective long period gratings. Temperatures are preferably monitored during a plasma etching or deposition process.

A control system, such as control system 385 (see FIG. 1) preferably controls processes performed by the plasma processing apparatus, substrate support and/or the temperature monitoring arrangement. A non-transitory computer machine-readable medium can comprise program instructions for control of the plasma processing apparatus and temperature monitoring arrangement such as sensor system 150. The computer program code for controlling the processing operations can be written in any conventional computer readable programming language: for example, assembly language, C, C++, Pascal, Fortran or others. Compiled object code or script is executed by the processor to perform the tasks identified in the program.

While the invention has been described in detail with reference to specific embodiments thereof, it will be apparent to those skilled in the art that various changes and modifications can be made, and equivalents employed, without departing from the scope of the appended claims.

What is claimed is:

1. A plasma processing apparatus for processing semiconductor substrates, comprising:
   a plasma processing chamber in which a semiconductor substrate is processed;
   a process gas source in fluid communication with the plasma processing chamber adapted to supply a process gas into the plasma processing chamber;
   a RF energy source adapted to energize the process gas into a plasma state in the plasma processing chamber;
   a vacuum source adapted to exhaust process gas and byproducts of the plasma processing from the plasma processing chamber; and
   a substrate support assembly comprising:
      a dielectric layer including a clamping electrode;

a heater layer attached to the underside of the dielectric layer, the heater layer including a plurality of planar thermal zones; and an optical fiber laterally extending in a channel embedded in the dielectric layer and arranged between the clamping electrode and the heater layer, the optical fiber including a plurality of gratings configured to measure temperatures of respective thermal zones, wherein the optical fiber is configured to be coupled to a temperature monitoring arrangement to monitor temperatures of the plurality of planar thermal zones measured by the plurality of gratings;

wherein the temperature monitoring arrangement includes a light source and a detector, the light source to provide near infrared, infrared, natural, or ultraviolet light into the optical fiber and the detector to measure light exiting the optical fiber; and wherein the temperature monitoring arrangement is configured to determine the temperatures of the plurality of planar thermal zones based on parameters of the light entering and exiting the optical fiber.

2. The plasma processing apparatus of claim 1, further comprising:
an adhesive to bond the optical fiber to walls of the channel;
a control system configured to control processes performed by the plasma processing apparatus and/or the temperature monitoring arrangement;
a non-transitory computer machine-readable medium comprising program instructions for controlling the temperature monitoring arrangement; and/or
the channel (i) includes one or more curves, (ii) is circular, (iii) is semicircular, and/or (iv) is patterned in a zig-zag pattern, a serpentine pattern, or a spiral pattern.

3. The plasma processing apparatus of claim 1, wherein the gratings include (i) fiber Bragg gratings and each fiber Bragg grating reflects a wavelength of light indicative of a local temperature thereof, or (ii) long period gratings and each long period grating transmits a wavelength of light indicative of a local temperature thereof.

4. The plasma processing apparatus of claim 1, wherein:
the channel includes one or more curves;
the channel is circular;
the channel is semicircular;
the channel is patterned in a zig-zag pattern, a serpentine pattern, or a spiral pattern; or
the channel includes an inlet in a non-exposed surface of the substrate support assembly or a lower surface of the substrate support assembly; or
the channel includes an inlet and an outlet in a non-exposed surface of the substrate support assembly.

5. A substrate support assembly comprising:
a dielectric layer including a clamping electrode;
a heater layer attached to the underside of the dielectric layer, the heater layer including a plurality of planar thermal zones; and
an optical fiber laterally extending in a channel embedded in the dielectric layer and arranged between the clamping electrode and the heater layer, the optical fiber including a plurality of gratings configured to measure temperatures of respective thermal zones,
wherein the optical fiber is configured to be coupled to a temperature monitoring arrangement to monitor temperatures of the plurality of planar thermal zones measured by the plurality of gratings;
wherein the temperature monitoring arrangement includes a light source and a detector, the light source to provide near infrared, infrared, natural, or ultraviolet light into the optical fiber and the detector to measure light exiting the optical fiber; and
wherein the temperature monitoring arrangement is configured to determine the temperatures of the plurality of planar thermal zones based on parameters of the light entering and exiting the optical fiber.

6. The substrate support assembly of claim 5, wherein:
the channel includes one or more curves;
the channel is circular;
the channel is semicircular; or
the channel is patterned in a zig-zag pattern, a serpentine pattern, or a spiral pattern; or
the channel includes an inlet in a non-exposed surface of the substrate support assembly; or
the channel includes an inlet and an outlet in a non-exposed surface of the substrate support assembly.

7. The substrate support assembly of claim 5, wherein the gratings include (i) fiber Bragg gratings and each fiber Bragg grating is configured to reflect a wavelength of light indicative of a local temperature thereof, or (ii) long period gratings and each long period grating is configured to transmit a wavelength of light indicative of a local temperature thereof.

8. The substrate support assembly of claim 5, further comprising:
an adhesive to bond the optical fiber to walls of the channel,
wherein the channel (i) includes one or more curves, (ii) is circular, (iii) is semicircular, and/or (iv) is patterned in a zig-zag pattern, a serpentine pattern, or a spiral pattern.

9. The substrate support assembly of claim 5, further comprising:
a control system configured to control processes performed by the substrate support assembly and/or the temperature monitoring arrangement; and/or
a non-transitory computer machine-readable medium comprising program instructions for controlling the temperature monitoring arrangement,
wherein each channel (i) includes one or more curves, (ii) is circular, (iii) is semicircular, and/or (iv) is patterned in a zig-zag pattern, a serpentine pattern, or a spiral pattern.

10. The substrate support assembly of claim 5, further comprising:
an electrostatic chuck; and
a cooling plate.

11. The substrate support assembly of claim 5, wherein:
the channel includes one or more curves;
the channel is circular;
the channel is semicircular; or
the channel is patterned in a zig-zag pattern, a serpentine pattern, or a spiral pattern; or
the channel includes an inlet in a non-exposed surface of the substrate support assembly; or
the channel includes an inlet and an outlet in a non-exposed surface of the substrate support assembly.

12. The substrate support assembly of claim 5, wherein:
the gratings include a plurality of fiber Bragg gratings wherein (i) each fiber Bragg grating is configured to reflect a wavelength of light indicative of a temperature at a different location along the optical fiber, (ii) each fiber Bragg grating is configured to reflect a wavelength of light indicative of the temperature of each of the respective thermal zones, or (iii) at least two fiber Bragg gratings are configured to each reflect a wavelength of light indicative of a temperature at a different location of each of the respective thermal zones; or the gratings include a plurality of long period gratings wherein (i) each long period grating is configured to transmit a wavelength of light indicative of a temperature at a different location along the optical fiber, (ii) each long period grating is configured to transmit a wavelength of light indicative of the temperature of each of the respective thermal zones, or (iii) at least two long period gratings are configured to each transmit a wavelength of light indicative of a temperature at a different location of each of the respective thermal zones.

13. The substrate support assembly of claim 12, further comprising a plurality of power supply lines and a plurality of power return lines, wherein each power supply line is connected to at least two thermal zones, each power return line is connected to at least one thermal zone, and no two thermal zones share the same pair of power supply line and power return line.

* * * * *